(12) United States Patent
Akiba

(10) Patent No.: US 9,017,525 B2
(45) Date of Patent: Apr. 28, 2015

(54) METHODS FOR FORMING METAL FLUORIDE FILM AND FOR MANUFACTURING OPTICAL DEVICE

(75) Inventor: Hideo Akiba, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 278 days.

(21) Appl. No.: 13/523,040

(22) Filed: Jun. 14, 2012

(65) Prior Publication Data

US 2012/0318663 A1 Dec. 20, 2012

(30) Foreign Application Priority Data

Jun. 17, 2011 (JP) ................................. 2011-135604

(51) Int. Cl.
*C23C 14/14* (2006.01)
*C23C 14/06* (2006.01)
*C23C 14/00* (2006.01)

(52) U.S. Cl.
CPC ......... *C23C 14/0694* (2013.01); *C23C 14/0057* (2013.01)
USPC ............ 204/192.15; 204/192.12; 204/192.13; 204/192.26; 204/192.27; 204/192.18

(58) Field of Classification Search
CPC .......................... H01J 37/3244; C23C 14/0694
USPC ............. 204/192.12, 192.13, 192.26, 192.27, 204/192.15
See application file for complete search history.

(56) References Cited

U.S. PATENT DOCUMENTS

| | | | | |
|---|---|---|---|---|
| 6,440,592 B1 * | 8/2002 | Meyer et al. | ................... | 428/701 |
| 6,458,253 B2 * | 10/2002 | Ando et al. | ............... | 204/192.15 |
| 2008/0207964 A1 * | 8/2008 | Rao et al. | ....................... | 570/169 |
| 2010/0078311 A1 | 4/2010 | Lee | | |

FOREIGN PATENT DOCUMENTS

| | | |
|---|---|---|
| CN | 101512043 A | 8/2009 |
| EP | 1134303 A1 | 9/2001 |
| JP | 4-289165 A | 10/1992 |
| JP | H07-166344 A | 6/1995 |
| JP | 2001-288565 A | 10/2001 |
| JP | 2002-47565 A | 2/2002 |
| JP | 2003-013212 A | 1/2003 |
| JP | 2009-144202 A | 7/2009 |
| WO | 2008/030276 A | 3/2008 |

OTHER PUBLICATIONS

Bo-Huei Liao et al., "Optical and mechanical properties of AlF3 films produced by pulse magnetron sputtering of Al targets with CF4/O2 gas", Optical Review, Springer, Berlin, DE, vol. 16, No. 4, Jun. 19, 2010, pp. 505-510, XP019806439.

(Continued)

*Primary Examiner* — Jason M Berman
(74) *Attorney, Agent, or Firm* — Canon U.S.A. Inc., IP Division

(57) ABSTRACT

In a method for forming a metal fluoride film, a metal fluoride film is formed on a substrate by sputtering using a metal target and a mixed gas containing $O_2$ gas and a reactive gas being a fluorocarbon gas.

8 Claims, 7 Drawing Sheets

PROJECTION REGION OF TARGET SURFACE

(56) References Cited

OTHER PUBLICATIONS

Bo-Huei Liao, Cheng-Chung Lee et al. Optical and Mechanical Properties of AlF3 Films Produced by Pulse Magnetron Sputtering of AL Targets With CF4/02 Gas, Optical Review vol. 16, No. 4 (2009) 505-510.

XP025007148—SIMS depth profiling of CdTe-based solar cells grown on sapphire substrates. M. Emziane, K. Durose, D.P. Halliday, Romeo, A. Bosio. Jan. 4, 2006.
Bo-Huei Liao, Cheng-Chung Lee, Cheng-Chung Jiang, Ming-Chung Liu. Optical and Mechanical Properties of AlF3 Films Produced by Pulse Magnetron Sputtering of Al Targets with CF402 Gas.

* cited by examiner

METHODS FOR FORMING METAL FLUORIDE FILM AND FOR MANUFACTURING OPTICAL DEVICE

BACKGROUND OF THE INVENTION

1. Field of the Invention

The present invention relates to methods for forming thin films.

2. Description of the Related Art

Metal fluorides such as aluminum fluoride ($AlF_3$) and magnesium fluoride ($MgF_2$) have been used for optical elements (lenses and mirrors) for visible light and for antireflection coatings formed on the optical elements.

Fluoride antireflection coatings (thin films) are formed mainly by vacuum evaporation. Vacuum evaporation is a method that can be performed with simple equipment and can form a thin film on a substrate having a large area at a high speed, and is thus superior in productivity. However, the thickness of a film formed by vacuum evaporation is liable to be reduced in portions distant from the deposition source, relative to the thickness near the deposition source. Accordingly, a substrate rotation mechanism is used for highly precisely controlling the thickness so that an uneven film is not formed depending on the relative position with respect to the deposition source. In addition, it has been difficult to develop an automatic machine for vacuum evaporation.

In order to enhance the adhesion between the film and the substrate and to reduce the absorption of the film, furthermore, a heating mechanism is undesirably required for heating the substrate to about 300° C.

Accordingly, sputtering is attracting attention as a method for forming fluoride antireflection coatings (thin films). Sputtering is superior to vacuum evaporation in reproducibility, and in reducing the unevenness of the film thickness and forming films at a low temperature. For forming a film by sputtering, charged particles are caused to collide with a target of a deposition material by applying a voltage, and particles of the deposition material produced by the collisions fly and are deposited on a substrate. When a fluoride antireflection coating is formed by sputtering, however, the reactivity between the sputtering material and fluorine may be insufficient, or the substrate may be easily damaged by charged particles. As a result, the fluoride antireflection coating on the substrate absorbs light having wavelengths larger than the band gap, and thus the antireflection property of the metal fluoride film is undesirably reduced.

Some solutions for this disadvantage have been proposed. For example, Japanese Patent Laid-Open No. 4-289165, which takes reactivity into account, discloses a method in which a metal fluoride is controlled to have a stoichiometric composition. In this method, a mixture of a fluorine-based gas, such as $F_2$ or $CF_4$, and an inert gas, such as Ar, is used as a sputtering gas so as to supply fluorine (F), which is often lacking, to the target. Japanese Patent Laid-Open No. 2002-47565, which takes into account the damage to the deposited film from plasma, discloses a sputtering apparatus using a cylindrical target to which a direct current is applied. In this apparatus, a sputtering gas is introduced through the bottom of the cylinder, and a reaction gas is introduced from a side near to the substrate.

However, when a metal fluoride is deposited on a substrate using $F_2$ gas as a reaction gas, cost is increased. $F_2$ gas is expensive. In addition, $F_2$ gas is harmful to the human body, and if it is used, facilities for safety measures are required. Thus, the use of $F_2$ gas is disadvantageous in terms of production cost.

Also, if a mixture of a fluorocarbon gas, such as $CF_4$, and an inert gas, such as Ar, is used for sputtering, elemental carbon or a carbon compound may be drawn into the deposited film. This increases optical loss and thus negatively affects the quality of the optical element in terms of optical properties.

Thus, known methods for thin film deposition have not reached a satisfactory level. The present invention provides a safe, inexpensive method for forming a metal fluoride film exhibiting low absorption in the visible region, by sputtering.

SUMMARY OF THE INVENTION

According to an aspect of the invention, a method is provided for forming a metal fluoride film on a substrate by reactive sputtering using a metal target and a mixed gas containing a reactive gas.

In the method, the mixed gas contains $O_2$ gas and the reactive gas that is a fluorocarbon gas.

In this method, since a safe, inexpensive fluorocarbon gas and oxygen are used, preliminary safety measures and aftertreatment can be simple. Also, since oxygen gas reacts with carbon to produce $CO_2$ which will be discharged as an exhaust gas, a high-quality metal fluoride film can be formed at a low cost. The method is useful for forming an antireflection coating of an optical device.

Further features of the present invention will become apparent from the following description of exemplary embodiments with reference to the attached drawings.

DESCRIPTION OF THE EMBODIMENTS

A method for forming a metal fluoride film having a low refractive index according to an embodiment of the invention will now be described with reference to the drawings. Although the present embodiment will be described using specific gases and specific materials, the invention is not limited to the disclosed embodiment.

Figure 1:
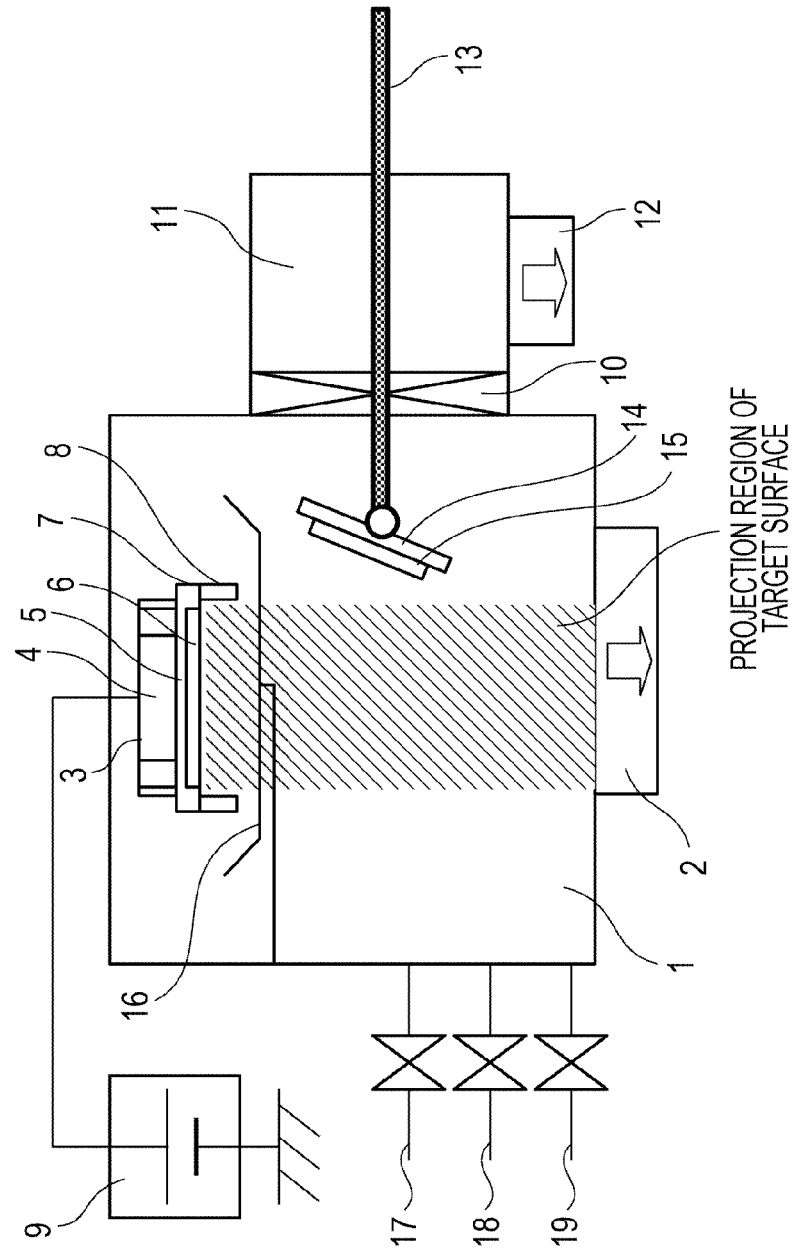
FIG. 1 is a schematic view of a deposition apparatus in which a method of an embodiment of the invention is performed.

FIG. 1 is a schematic view of a deposition apparatus used in the method of the present embodiment.

The deposition apparatus includes a deposition chamber 1 maintained in a vacuum state, and an evacuation system 2 including a vacuum pump with which the deposition chamber 1 is evacuated. A target unit 3 is placed in the deposition chamber 1, which is a vacuum chamber. The target unit 3 includes a cooling box 4 in which a magnet is placed and cooling water delivered from the outside flows so as to cool the target. The magnet is disposed so as to generate a magnetic field in a direction parallel to the surface of the target.

In order to keep the surface temperature of the target constant, the target is cooled from the rear side through a backing plate 5 with the cooling water controlled to a desired temperature with a chiller (not shown) at a constant flow rate. More specifically, the backing plate 5 acts as a cathode in the cooling box 4, as shown in FIG. 1.

The target 6 is secured to the backing plate 5. An anode 8 is disposed around the backing plate 5 with an insulating material 7 therebetween. A DC power source 9 for supplying a direct current is connected between the anode 8 and the cathode or backing plate 5. The deposition chamber 1 is installed in such a manner that a side thereof different from the side provided with the target unit 3 is adjacent to a load lock chamber 11 with a gate valve 10 therebetween. The load lock chamber 11 is provided with another evacuation system 12 independent of the deposition chamber 1. In addition, a substrate holder 14 is connected to a carrying mechanism 13 for easy transfer between the load lock chamber 11 and the deposition chamber 1. A substrate 15 will be placed on the substrate holder 14. Thus, the substrate 15 can be carried into and out of the deposition chamber 1 without being exposed to the atmosphere. The substrate holder 14 has a turning mechanism that varies the relative angle between the surface of the target 6 and the surface of the substrate holder 14 on which the substrate is disposed and a rotation mechanism that rotates the substrate holder 14. In order to prevent deposition from being performed on the substrate (which may be a lens) before electric discharge is stabilized, a shielding plate 16 is provided between the substrate holder 14 and the target 6. The open and closed states of the shielding plate 16 can be switched quickly. The deposition chamber 1 is configured so that gases can be introduced through a sputtering gas inlet 17 and reactive gas inlets 18 and 19 by a gas supply system including mass flow controllers. Any one of the inert gases Ar, He, Ne, Kr and Xe is introduced as a sputtering gas through the sputtering gas inlet 18, and $O_2$ gas and a fluorocarbon gas (reactive gas) are introduced through the reactive gas inlets 18 and 19, respectively. The flow rates, purities and pressures of the gases introduced are precisely controlled by the mass flow controllers and a gas purification apparatus.

A process for forming a metal fluoride film using the deposition apparatus shown FIG. 1 will now be described as an embodiment of the invention. First, the deposition chamber 1 is opened, and a target 6 is mounted on a cathode (backing plate 5) in the deposition chamber 1. The target 6 is appropriately selected according to the thin film to be formed. For example, for forming a metal fluoride film having a low refractive index, a metal target such as a magnesium (Mg) or aluminum (aluminum) target is suitable. Any other metals except pure gold containing fluorine may be used as the material of the target as long as the electric resistance of the material is low. The deposition chamber 1 is then closed and evacuated to a vacuum of about $10^{-3}$ Pa by operating the evacuation system 2. In a state where preparation has been completed, the substrate holder 14 is disposed in the load lock chamber 11. The load lock chamber 11 is opened with the gate valve 10 closed, and a substrate 15 is mounted on the substrate holder 14. The substrate 15 may be made of calcium fluoride crystal, quartz glass, silicon, glass, or a resin. The position of the substrate holder 14 is adjusted in advance by the turning mechanism for adjusting the relative angle between the surface of the target 6 and the surface of the substrate holder 14 so that deposition can be performed at a uniform thickness in a direction along the surface of the substrate 15. The load lock chamber 11 is then closed and evacuated to a vacuum of about $10^{-3}$ Pa by operating the evacuation system 12.

On completion of the evacuation, the gate valve 10 is opened, and the substrate holder 14 is carried to the position where deposition is performed in the deposition chamber 1 by the carrying mechanism 13, thus coming into a stand-by state for a subsequent operation. In order to increase the quality of the deposited film, this stand-by position may be determined so that deposition can be performed at a uniform thickness in a direction along the surface of the substrate 15, and so that the surface of the substrate 15 can be located outside the region where the surface of the target 6 is projected in a direction perpendicular to the surface of the target 6. If a reactive sputtering is performed in an ordinary parallel plate magnetron sputtering apparatus, the reactive gas may cause a chemical reaction at the surface of the target and form a thin compound film of aluminum fluoride ($AlF_3$), magnesium fluoride ($MgF_2$) or the like. If a surface covered with the compound film is subjected to sputtering, negative ions are produced. The negative ions are accelerated with an ion sheath voltage, thus turning into negative ions having an accelerated high kinetic energy and a directivity. The negative ions are accelerated in a direction almost perpendicular to the surface of the target 6. If the substrate 15 is located within the region where the surface of the target 6 can be projected in a direction perpendicular to the surface of the target 6, the negative ions having a high kinetic energy collide with the substrate 15 and may damage the substrate 15. In contrast, if the substrate 15 is disposed so that the normal to the surface of the target 6 does not intersect the surface of the substrate 15, the damage to the substrate 15 can be reduced even if negative ions are produced.

It is thus advantageous to dispose the substrate 15, as needed according to the desired optical properties, so that the surface thereof is located outside the region where the target 6 can be projected in a direction perpendicular direction to the sputtering surface of the target 6. However, this is not necessarily required in other embodiments.

The substrate 15 is brought into a stand-by state in the deposition chamber 1, and the shielding plate 16 is closed so that deposition is not performed on the substrate 15. In this state, an inert gas, such as Ar, He, Ne, Xe, or Kr, is introduced into the deposition chamber 1 through the sputtering gas inlet 17, and a sputtering DC voltage is applied to the backing plate 5 from the DC power source 9. Consequently, glow discharge occurs to ionize the inert gas, such as Ar gas. DC power is suitable as the source power. A high-frequency AC power generates a high self-bias voltage at the substrate. If a self-bias voltage is generated, positive ions can be accelerated by a self-bias voltage and enter the substrate, thus damaging the substrate.

Plasma generated by applying a DC voltage is stable even if the pressure in the deposition chamber 1 is as low as a few tenths of a pascal. The reason why plasma is generated under such a low pressure is that cyclotron motion of electrons is caused in a plane perpendicular to the magnetic field by the magnetron effect of the magnet in the cooling box 4 and thus increases the electron density in the vicinity of the target 6. In addition, the magnetron effect of the magnet reduces the electron temperature and electron density in the vicinity of the substrate 15 as well as increasing the electron density in the vicinity of the target 6. Accordingly, the entering of high-energy charged particles into the substrate can be suppressed to reduce the damage to the substrate 15 and the thin film deposited on the substrate 15.

Then, $O_2$ gas and a fluorocarbon gas are introduced to the deposition chamber 1 through the reactive gas inlets 18 and 19, respectively.

On introducing $O_2$ gas and the reactive gas, the surface of the target 6 is oxidized or fluorinated and thus can be easily coated with an insulating material. Then, the insulating material is charged and thus electrically broken down by ions or electrons. Consequently, abnormal discharge becomes liable to occur. If abnormal discharge occurs, foreign matter is easily made to fly by the discharge and introduced into the film. Consequently, the surface of the film becomes rough. Abnormal discharge can be prevented by applying a pulsed DC voltage with a frequency of several kilohertz to cancel the charge of the insulating material. However, if the frequency of the pulsed DC voltage is excessively increased, a self-bias voltage is generated at the substrate as described above. Consequently, positive ions enter the substrate and damage the substrate. In the present embodiment, the frequency can be 100 kHz or less. It has been found that plasma does not damage the thin film and the substrate much at such a frequency.

The gases used in the sputtering performed in the present embodiment will be described below.

A fluorocarbon is a compound produced by substituting fluorine atoms for some of the hydrogen atoms of a hydrocarbon. Fluorocarbons, which are characterized by their safety, are used in a wide range of fields. For example, fluorocarbons are used as (1) refrigerants for car air-conditioners, household and industrial air-conditioners, refrigerators, and freezers; (2) foaming agents for heat insulating materials, shock absorbers and the like; (3) cleaning agents for precision components, electronic components and other components; (4) propellants for medical aerosols and the like; (5) fire extinguishers; (6) semiconductor etching agents; and (7) intermediate materials. On the other hand, fluorocarbons cause ozone layer destruction and global warming. It is therefore required to take responsible measures against the discharge of fluorocarbons while utilizing their advantages.

The deposition pressure in the deposition chamber 1 after the sputtering gas, $O_2$ gas, and the reactive gas have been introduced is kept in the range of 0.1 to 3.0 Pa by adjusting the evacuation system 2 and the valves and mass flow controllers of the sputtering gas inlet 17 and the reactive gas inlets 18 and 19. If the pressure is excessively increased, a film having a coarse surface and a low density is formed. If the pressure is excessively reduced, discharge is likely to decrease. After ensuring the discharge voltage has been stabilized, the shielding plate 16 is opened and deposition is started. Since sputtering particles being emitted from the surface of the target have an emission angle distribution and travel in various directions, the particles can be deposited on the substrate even though the surface of the substrate is located outside the projection region of the surface of the target. At this time, the sputtered particles react with the active gas containing fluorine to form a metal fluoride film.

In the present embodiment, a fluorocarbon gas as a reactive gas and $O_2$ gas are simultaneously used in order to form a metal fluoride film transparent in the visible region and exhibiting a low optical loss. The present inventors have found that processes using a fluorocarbon gas singly as a reactive gas have the following problems:

(1) It is difficult to produce a gas molecule having a sufficient number of fluorine atoms only through impacts of electrons with a fluorocarbon gas in plasma to break the intramolecular bonding of the fluorocarbon gas. Consequently, it is difficult to obtain a sufficient amount of fluorine relative to obtaining a sufficient amount of Mg or Al that is to be introduced to the substrate from the target by sputtering. This is more pronounced particularly in sputtering processes for forming a metal fluoride in a low-electron density distribution so as to reduce damage from plasma. In such a process, electron impacts do not satisfactorily break the C-F bonds.

(2) C or a compound containing C, produced by decomposition of the fluorocarbon in plasma, may be drawn into the film and act as an impurity in the film. A metal fluoride film containing a large amount of C or a C component exhibits a large optical loss in the visible region.

It has been found that these problems can be solved by electric discharge using a fluorocarbon gas and $O_2$ in combination. First, $O_2$ molecules or O atoms cause an oxidation decomposition reaction (combustion reaction) of the fluorocarbon or decomposition products from the fluorocarbon. Thus reaction-active fluorine atoms or gas molecules containing fluorine are produced. For example, $CF_x$ and $O_2$ or O produce $COF_2$, CO, $CO_2$, F and $F_2$ through the following reactions expressed by formulas (1) to (5):

$$O+CF_3 \rightarrow COF_2+F \tag{1}$$

$$O+CF_2 \rightarrow CO+2F \tag{2}$$

$$O+CF_2 \rightarrow COF+F \tag{3}$$

$$O+CF_2 \rightarrow COF_2 \tag{4}$$

$$O+COF \rightarrow CO_2+F \tag{5}$$

The inventors found that reaction-active fluorine atoms or gas molecules containing fluorine can be produced in an amount sufficient to form a metal fluoride film having a stoichiometric composition by using these oxidation decomposition reactions (combustion reactions). In addition, it has been found that in this reaction process, $O_2$ reacts with the fluorocarbon to be converted to $CO_2$, $COF_2$ and the like, and that these reaction products can be discharged without being drawn into the film. $CO_2$ and $COF_2$ to be discharged as an exhaust gas, which have low global warming potentials of 1 and less than 1 respectively, do not require an expensive exhaust gas treatment apparatus for decomposing and removing greenhouse gases.

The term "global warming potential" is a measure of the global warming effect for 100 years of a gas per concentration in the atmosphere and is represented relative to the effect of $CO_2$. Various gases have global warming potentials in the range of about 0.1 to 20,000.

Also, $COF_2$, which is reactive, can be removed in an exhaust gas treatment apparatus by an ordinary dry process in which $COF_2$ in exhaust gas is allowed to react with a chemical treatment agent to be converted to safe compounds and is thus fixed into the treatment agent.

As described above, by using a safe, inexpensive fluorocarbon gas and oxygen gas, preliminary safety measures and aftertreatment can be simplified, and accordingly, fluorocarbon films can be formed at a low cost. These films are deposited on a substrate in the form of a single layer or a multilayer composite and can function as antireflection coatings, reflection coatings and filters of optical components. Also, the method of the present embodiment is useful in producing an optical device including an optical element covered with an antireflection coating or the like.

EXAMPLE

Method for Forming a Thin Film

An Example of the method of the invention will be described in detail. In the example, a $MgF_2$ thin film exhibiting a low absorption and having a low refractive index was formed on a substrate using the apparatus shown in FIG. 1. Mg was used as the metal target, and the substrate 15 was a BK7 substrate made of borosilicate glass. A fluorocarbon gas 1,1,1,3,3-pentafluoropropane ($CHF_2CH2CF_3$, HFC-245fa) as a reactive gas and $O_2$ gas were introduced into the deposition chamber 1. In these years, hydrofluorocarbon (HFC) gases are being developed which do not destroy the ozone layer and are less global warming (have lower global warming potentials) than ever. HFC-245fa is a foaming agent for producing rigid urethane foam used as a heat insulating material for refrigerators, and is used as an alternative to chlorofluorocarbon (HCFC-141b, 1,1-dichloro-1-fluoroethane $C_2H_3C_{12}F$) whose use has been prohibited for environmental control. HFC-245fa has a global warming potential of 950 and is incombustible and less toxic. HFC-245fa is a refrigerant number specified in ISO817. Fluorocarbon gases such as HFC-365mfc and HFC-C447ef may be used as the reactive gas from the above-described viewpoint.

First, a washed substrate 15 was placed in the load lock chamber 11, and the load lock chamber 11 was evacuated to $1\times10^{-3}$ Pa or less. After the evacuation, the substrate 15 on the substrate holder 14 was carried into the deposition chamber 1 through the gate valve 10 by the carrying mechanism 14, and was disposed in the deposition position in the deposition chamber 1. The distance between the target 6 and the substrate 15 was about 80 mm during deposition. After the shielding plate 16 was closed, Ar was introduced at a flow rate of 300 SCCM through the sputtering gas inlet 16, and then $O_2$ gas and HFC-245fa were introduced at flow rates of 8 SCCM and 15 SCCM through the reactive gas inlets 18 and 19, respectively. The total pressure was controlled to 0.71 Pa. A sputtering power of 200 W was applied to the cathode (backing plate) 6 from the DC power source 9 to generate magnetron plasma at the surface of the target 6.

At the same time, a square-wave pulsed DC voltage with a frequency of 5 kHz for reversing the polarity of the surface of the target 6 was applied to cancel the charge at the surface of the target 6. This can ensure stable discharge. Discharge was continued for a while, and when a time for which the discharge could be stabilized had elapsed, the shielding plate 16 was opened, and deposition was started. The discharge voltage for deposition was 465 V. In this example, the target 6 and the substrate 15 were arranged so that the substrate 15 was not intersect the region where the target 6 was projected in a direction perpendicular to the surface of the target 6. Thus, the substrate 15 was prevented from being affected by negative ions produced at the surface of the target 6 and accelerated by the cathode voltage. In the example, in addition, the self-bias, which can be increased by high-frequency discharge, was reduced by applying a voltage to the target 6 from the DC power source. Thus, the self-bias voltage did not accelerate positive ions much, and consequently, the substrate was not damaged much from the positive ions entering the substrate. $O_2$ gas and the reactive gas HFC-245fa were simultaneously used. If the substrate 15 is disposed within the region where the sputtering surface of the target can be projected in a direction perpendicular to the sputtering surface, the resulting film is colored brown and exhibits optical loss in the visible region. This is caused by damage from negative ions accelerated by the cathode voltage.

If the flow rate of $O_2$ is much lower that the flow rate of the HFC-245fa, the film is colored brown and exhibits large optical loss as well. This is because the deposited $MgF_2$ film becomes metallic mainly due to a deficiency of fluorine in the film. In contrast, if the flow rate of $O_2$ is much higher than the flow rate of HFC-245fa, a transparent film exhibiting small optical loss in the visible region can be formed, but the refractive index of the film exceeds 1.40 at a visible wavelength of 500 nm. This is because the deposited film is made of an oxide rather than a fluoride. In general, MgO and $MgF_2$ have refractive indices of about 1.72 and 1.38, respectively, at a wavelength of 500 nm. When HFC-245fa accounted for 70% in the mixed gas, the best results were obtained.

The percentage of the fluorocarbon gas in the mixed gas can be 50% to 90%.

If the percentage of the fluorocarbon gas is less than 50%, the material of the deposited film does not sufficiently contain fluorine, and thus an oxide film may be formed. If it exceeds 90%, oxygen gas becomes insufficient to remove carbon. Consequently, impurities containing carbon remain in the deposited film. This can cause a low-quality film to be produced.

Figure 2:
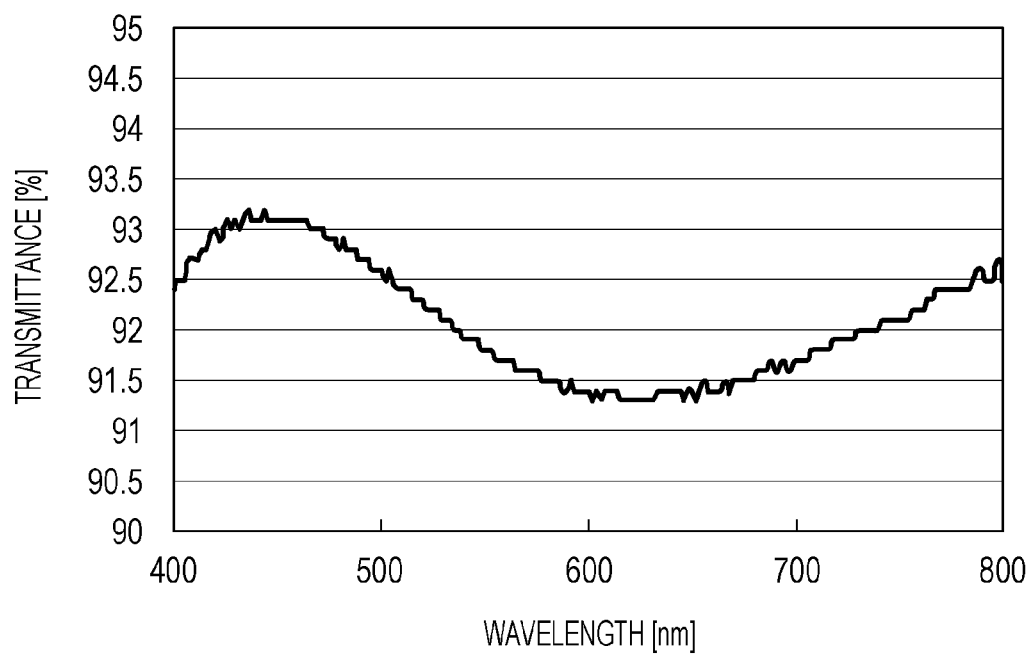
FIG. 2 is a plot of the wavelength dependence of the transmittance of a $MgF_2$ film deposited by a method according to an embodiment of the invention.
Figure 3:
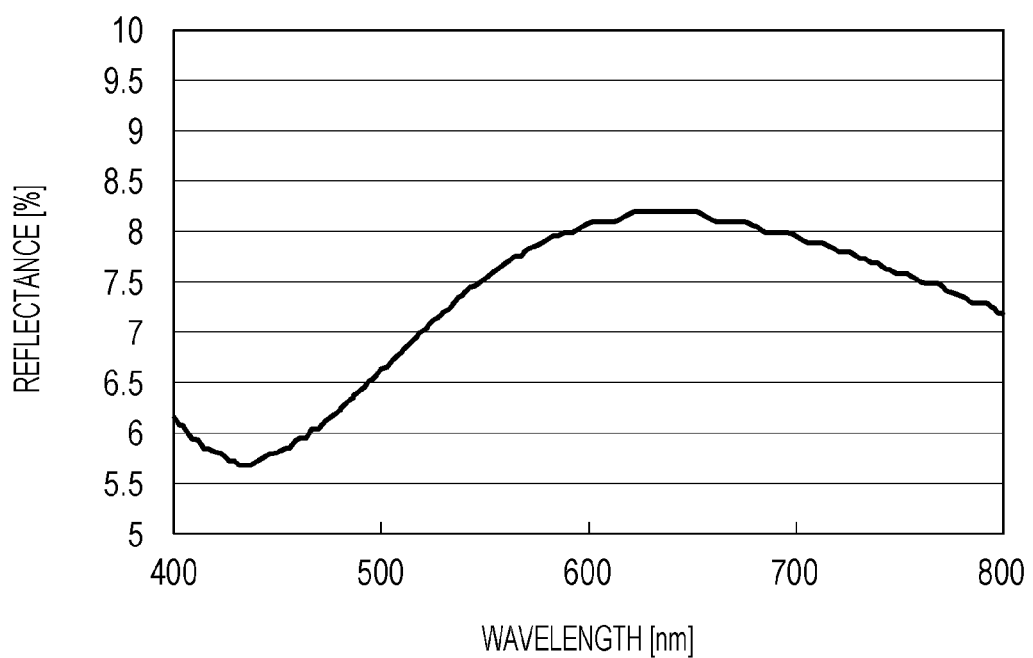
FIG. 3 is a plot of the wavelength dependence of the reflectance of the $MgF_2$ film.
Figure 4:
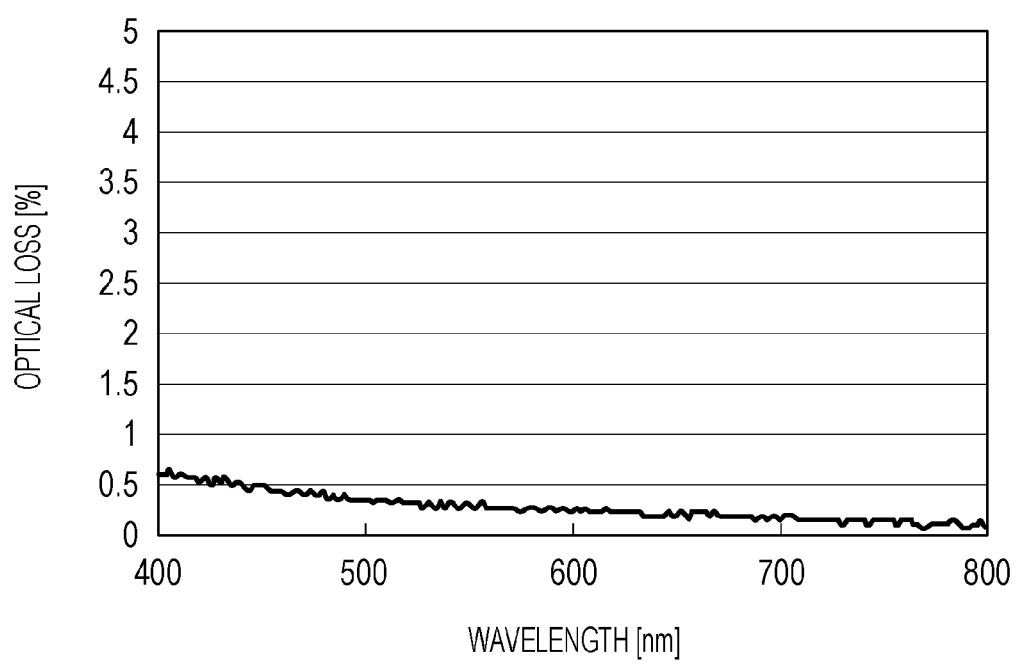
FIG. 4 is a plot of the wavelength dependence of the optical loss of the $MgF_2$ film.
Figure 5:
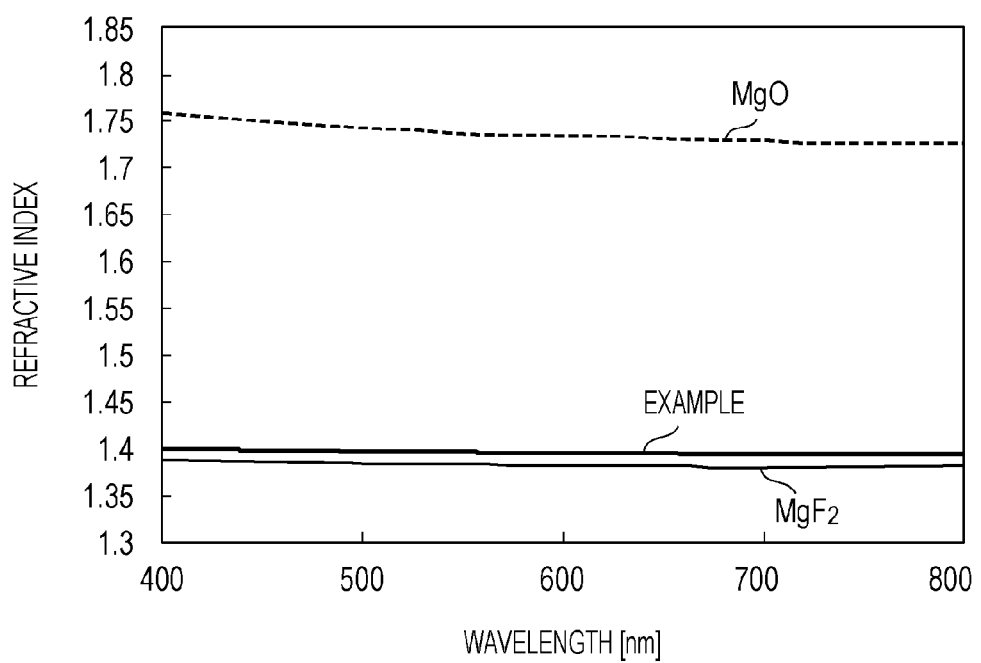
FIG. 5 is a plot of the wavelength dependence of the refractive index of the $MgF_2$ film.

FIGS. 2, 3 and 4 show the wavelength dependences of the transmittance, the reflectance and the optical loss, respectively, of the $MgF_2$ film formed in the Example. FIG. 5 shows the wavelength dependence of the refractive index calculated from the transmittance, reflectance and optical loss shown in FIGS. 2, 3 and 4. In this instance, the deposition rate was about 7.7 nm/min, and the $MgF_2$ film evaluated had a thickness of about 230 nm. FIGS. 2, 3, 4 and 5 show that the $MgF_2$ film formed in the Example was a low-absorption, low-refractive-index film exhibiting an optical loss of 0.3% or less and a refractive index of about 1.40 at a wavelength of 500 nm, in the visible region, for a thickness of 100 nm.

Since the entering of charged particles in plasma to the substrate was suppressed in the Example, the $MgF_2$ film was formed at a substrate temperature of 80° C. or less. The resulting $MgF_2$ film had a high adhesion and was as hard as a hard coat formed by vacuum evaporation (heated at 300° C.). Also, the packing density of the film was close to 100% and was such that most optical properties would not vary with time. Thus, a $MgF_2$ film, which can be formed only on a substrate heated to 300° C. or more in the known process, was formed at 60° C. or less. Accordingly, plastic plates or the like can be used as the substrate 15. Also, since the sputtering rate is stable, the thickness of the film can be more precisely controlled in comparison with the known vacuum evaporation and, thus, a high-quality optical thin film can be formed. Optical components, such as antireflection coatings and mirrors, formed by laminating such optical thin films can exhibit satisfactory properties as designed. The target 6 may be a flat plate and have a simple structure, and accordingly the equipment coast can be reduced.

Exhaust Gas Treatment

The treatment of the exhaust gas in the process using $O_2$ gas and a reactive gas HFC-245fa will now be described.

Figure 6:
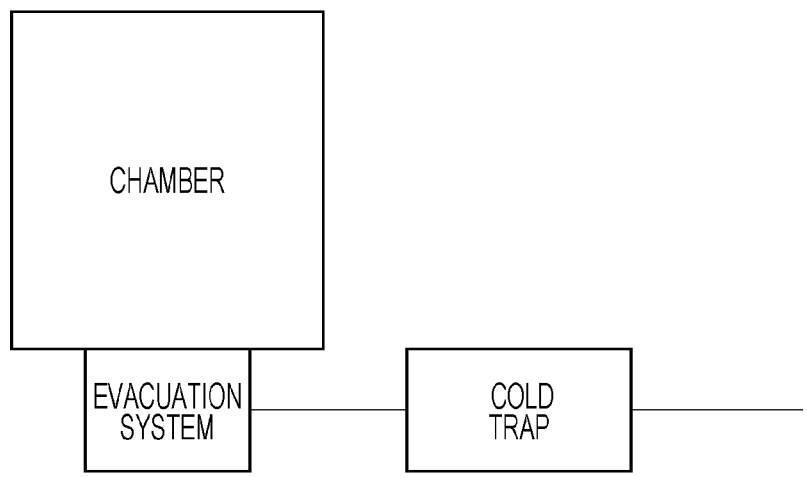
FIG. 6 is a schematic block diagram of an apparatus including an evacuation system provided with a cold trap.

As described above, it was found that oxidation decomposition reaction (combustion reaction) of a fluorocarbon gas and $O_2$ produces $COF_2$, CO, $CO_2$, F and $F_2$ and discharges $CO_2$ and $COF_2$ as an exhaust gas. $CO_2$ and $COF_2$ to be discharged, which have low global warming potentials of 1 and less than 1 respectively, do not require an expensive exhaust gas treatment apparatus for decomposing and removing greenhouse gases. However, the fluorocarbon may be discharged without being decomposed. Accordingly, the exhaust line of the evacuation system 2 was provided with a cold trap. FIG. 6 is a schematic block diagram of a structure in which the evacuation system 2 is provided with a cold trap to recover the undecomposed fluorocarbon. The cold trap is disposed downstream from the evacuation system 2 including a vacuum pump that evacuates the decomposition chamber 1.

Figure 7:
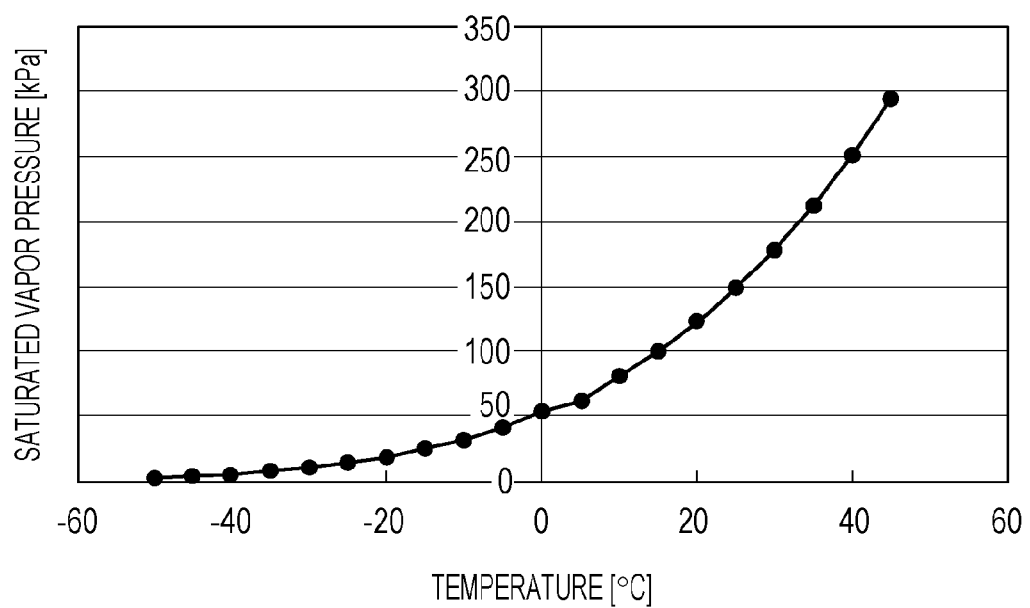
FIG. 7 is a saturated vapor pressure curve of HFC-245fa.

Therefore, the pressure in the cold trap is about atmospheric pressure (101.325 kPa) at room temperature (about 20° C.). FIG. 7 is the saturated vapor pressure curve of HFC-245fa. As shown in FIG. 7, the saturated vapor pressure of HFC-245fa is 122.87 kPa at 20° C. Therefore, HFC-245fa is gaseous in the cold trap under the conditions of room temperature (about 20° C.) and atmospheric pressure (101.325 kPa). On the other hand, in general, saturated vapor having a saturated vapor pressure or more is condensed into liquid, and the saturated vapor pressure varies depending on the temperature. If HFC-245fa is cooled to −50° C., the saturated vapor pressure decreases to 2.78 kPa. Accordingly, in theory, an amount of HFC-245fa equivalent to a vapor pressure of 98.5 kPa is condensed into liquid by cooling HFC-245fa to −50° C., and thus, about 97% (=98.5 kPa/101.325 kPa) of the HFC-245fa can be recovered. An experiment was performed in which HFC-245fa was singly allowed to flow in the deposition chamber 1 shown in FIG. 1, and the cooling temperature of the cold trap was set at −50° C. so that HFC-245fa could be trapped in the cold trap shown in FIG. 6. The changes in the mass (volume) of the HFC-245fa gas in the gas supply system were compared with the changes in the mass of the trapped gas. As a result, 90% or more of the HFC-245fa was recovered by the cold trap of −50° C. On the other hand, $COF_2$, CO, $CO_2$ and $F_2$ produced by the oxidation decomposition reaction (combustion reaction) of HFC-245fa with $O_2$ in the plasma have saturated vapor pressures higher than atmospheric pressure (101.325 kPa), and are accordingly not collected in the cold trap. Therefore, only HFC-245fa can be recovered, and the recovered HFC-245fa can be reused. For disposal of reactive $COF_2$ and $F_2$, a simple dry remover can be provided as an exhaust gas treatment apparatus downstream from the cold trap. Thus, a fluorocarbon gas having a low saturated vapor pressure, such as HFC-245fa, can be recovered by using a cold trap, which is a simple technique, and the recovered gas can be reused.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-135604 filed Jun. 17, 2011, which is hereby incorporated by reference herein in its entirety.

What is claimed is:

1. A method for forming a metal fluoride comprising:
    forming a metal fluoride film on a substrate by reactive sputtering using a target of a metal and a mixed gas containing a reactive gas,
    wherein the reactive gas contains one of 1,1,1,3,3-pentafluoropropane, 1,1,1,3,3-pentafluorobutane, and 1,2,2,3,3,4-heptaflurocyclopentane, and
    wherein the mixed gas contains $O_2$ gas.

2. The method according to claim 1, wherein the fluorocarbon gas is 1,1,1,3,3-pentafluoropropane expressed by $CHF_2CH_2CF_3$.

3. The method according to claim 1, wherein the sputtering is performed by applying a direct-current voltage to the target, or by applying a pulsed direct-current voltage with a frequency of 100 kHz or less to the target.

4. The method according to claim 1, wherein the metal is Mg or Al.

5. The method according to claim 1, wherein the sputtering is performed with the substrate located outside a region where the surface of the target is projected in a direction perpendicular to the surface of the target.

6. The method according to claim 1, wherein the fluorocarbon gas accounts for 50% to 90% of the mixed gas.

7. A method for manufacturing an optical device, comprising forming a film on a surface of the substrate by the method as set forth in claim 1, wherein the substrate is an optical element.

8. The method according to claim 1, wherein the metal is Mg.

* * * * *